US006923656B2

(12) United States Patent
Novotny et al.

(10) Patent No.: US 6,923,656 B2
(45) Date of Patent: Aug. 2, 2005

(54) LAND GRID ARRAY SOCKET WITH DIVERSE CONTACTS

(75) Inventors: Shlomo Novotny, Wayland, MA (US);
Istvan Novak, Maynard, MA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/685,069

(22) Filed: Oct. 14, 2003

(65) Prior Publication Data

US 2005/0079744 A1 Apr. 14, 2005

(51) Int. Cl.[7] ............................................. H01R 12/00
(52) U.S. Cl. .............................. 439/66; 439/70; 439/71
(58) Field of Search ............................... 439/66, 70, 71

(56) References Cited

U.S. PATENT DOCUMENTS 6,752,635 B1 * 6/2004 Searls et al. ................... 439/71

* cited by examiner

Primary Examiner—Tho D. Ta
(74) Attorney, Agent, or Firm—Kudirka & Jobse, LLP (57) ABSTRACT

A socket, such as a Land Grid Array (LGA) socket, for forming electrical connections between a first surface having a first contact array and a second surface having a second contact array. The socket includes a plurality of compliant contacts, each contact inserted into one of a plurality of passages that extend through a plate. Each contact has a first contact surface for electrically engaging the first contact array, and a second contact surface for electrically engaging the second contact array. At least one of the contacts is a low current contact, and at least one of the contacts is a high current contact capable of passing more current than the low current contact.

35 Claims, 5 Drawing Sheets

LAND GRID ARRAY SOCKET WITH DIVERSE CONTACTS

TECHNICAL FIELD

The present invention generally relates to integrated circuit device packaging, and in particular, a socket with diverse contacts, such as a Land Grid Array socket.

BACKGROUND ART

Electronic components are rapidly increasing in performance and miniaturization, due in part to tremendous competition and market demands. This, in turn, has required an increase in electronic board component contact densities. A variety of high-density socket technologies have resulted.

One of the more attractive socket technologies now commonly in use is a Land Grid Array (LGA) socket. As opposed to other socket technologies, LGA sockets typically do not require soldering when attaching the socket to a circuit board or other electronic module. Instead, an electrical connection is established through pad-to-pad contact by clamping the IC device to the circuit board through an intervening LGA socket having compliant, coplanarity-maintaining contacts.

Figure 1:
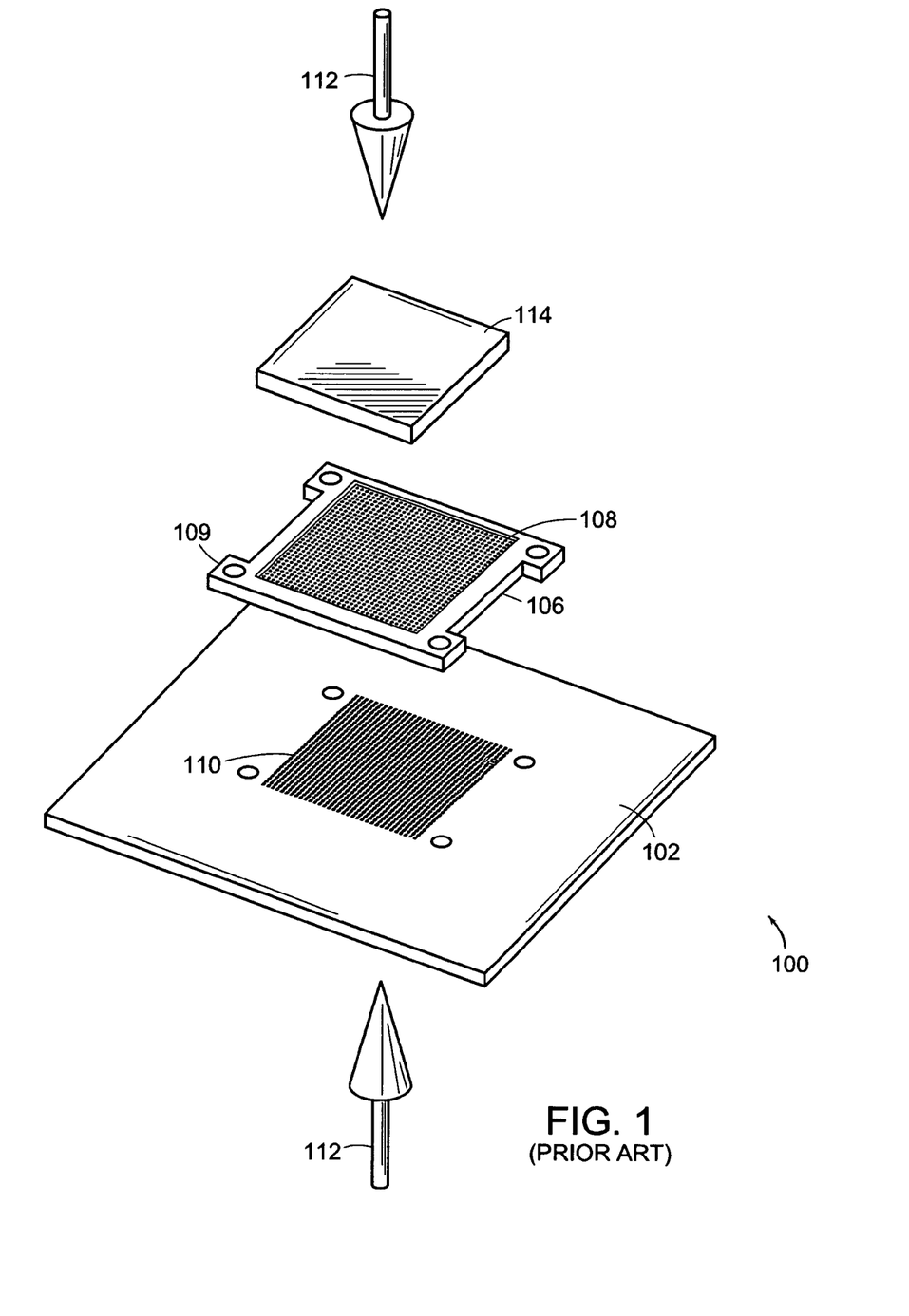
FIG. 1 is a schematic of an exploded LGA socket assembly (prior art)

FIG. 1 is a schematic of an exploded LGA socket assembly 100. A LGA socket 106 is compressed between a circuit board 102 and an electronic module 114 to achieve an electrical connection via forces 112. The LGA socket 106 includes a plurality of small, uniformly shaped contacts 108 that are typically arranged in a dense rectangular array. Each contact 108 is double-sided and electrically coupled to corresponding contacts 110 on the circuit board 102 and electronic module 114.

Due to their small size, each LGA contact has limited current carrying capability. Consequently, applications often require that more than one contact be used to transfer high current, such as power. This results in an increase in the number of contacts needed, increasing the size of the LGA socket and introducing various mechanical challenges.

For example, controlling flatness becomes more of an issue as the number of contacts on the LGA socket increases. Due to the flexible nature of one or more of the surfaces involved, warpage may be induced when applying the compressive force. Poor electrical connections between the socket and the first and/or second surfaces may result.

Another concern that will be encountered as devices become faster is the effects of electromagnetic interference (EMI). In particular, as the operating frequency of devices increase, grounding between devices and circuit boards becomes critical for EMI containment.

SUMMARY OF THE INVENTION

In accordance with a first aspect of the invention, a socket for forming electrical connections between a first surface having a first contact array and a second surface having a second contact array is presented. The socket includes a plurality of compliant contacts, each contact inserted into one of a plurality of passages that extend through a plate. Each contact has a first contact surface for electrically engaging the first contact array, and a second contact surface for electrically engaging the second contact array. At least one of the contacts is a low current contact, and at least one of the contacts is a high current contact capable of passing more current than the low current contact.

In accordance with another aspect of the invention, a method of passing signals between a first surface having a first contact array and a second surface having a second contact array is presented. The method includes providing a socket having a plurality of compliant contacts. At least one of the contacts is a low current contact and at least one of the contacts is a high current contact. The socket is compressed between the first surface and the second surface, such that a first contact surface of each contact is electrically coupled to the first contact array, and a second contact surface of each contact is electrically coupled to the second contact array. A current is passed through the high current contact, the current greater than a maximum current that can be passed through the low current contact.

In accordance with yet another aspect of the invention, a socket for forming electrical connections between a first surface having a first contact array and a second surface having a second contact array is presented. The socket includes a plate having a thickness, the plate including surfaces defining a plurality of passages extending through the thickness of the plate. The socket further includes a plurality of compliant contacts, with each contact inserted into one of the passages. Each contact includes a first contact surface for electrically engaging the first contact array and a second contact surface for electrically engaging the second contact array. At least one of the contacts is a small contact and at least one of the contacts is a large contact, the large contact at least twice as big in size as the small contact.

In accordance with still another embodiment of the invention, a method of passing signals between a first surface having a first contact array and a second surface having a second contact array is presented. The method includes providing a socket, such as a land grid array socket, having a plurality of compliant contacts. At least one of the contacts is a small contact and at least one of the contacts is a large contact, the large contact twice as big in size as the small contact. The socket is compressed between the first surface and the second surface, such that a first contact surface of each contact is electrically coupled to the first contact array, and a second contact surface of each contact is electrically coupled to the second contact array.

In accordance with another embodiment of the invention, a plate for a socket is presented, the socket including a plurality of double sided contacts for forming electrical connections between a first surface having a first contact array and a second surface having a second contact array. The plate has a thickness. The plate includes surfaces defining an array of passages, each passage extending through the thickness of the plate such that one of the contacts can be inserted into each passage. At least one of the passages is a small passage having a first size, and at least one of the passages is a large passage having a second size larger than the first size. The large passage is capable of having a larger contact inserted compared to the small passage.

BRIEF DESCRIPTION OF THE DRAWINGS

The foregoing features of the invention will be more readily understood by reference to the following detailed description, taken with reference to the accompanying drawings, in which.

DETAILED DESCRIPTION OF SPECIFIC EMBODIMENTS

In illustrative embodiments of the invention, a socket for forming electrical connections between a first surface having a first contact array and a second surface having a second contact array is presented. The socket includes non-uniform, diverse contacts that advantageously vary, for example, in current carrying capability, size and/or shape. Details of various embodiments are discussed below.

Figure 2:
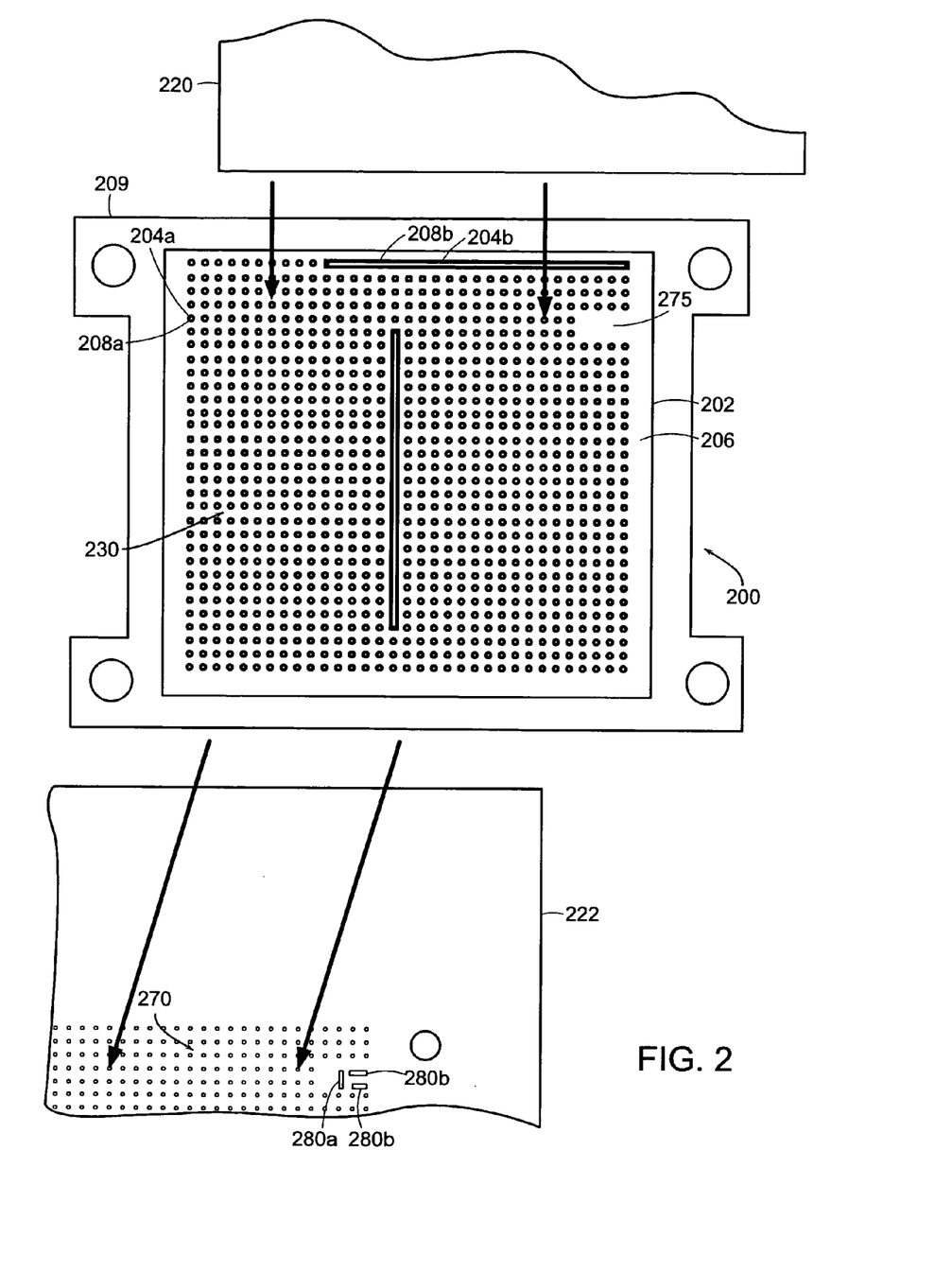
FIG. 2 is a schematic of a top view of a socket, in accordance with one embodiment of the invention.

FIG. 2 is a schematic of a top view of a Land Grid Array (LGA) socket 200, in accordance with one embodiment of the invention. The LGA socket 200 includes a flat plate 202 having a top surface 206 and a bottom surface (not shown). The plate is typically made of an insulating material, such as plastic, and may be attached to a frame 209. The frame 209 may provide support for the plate 202 and include various mounting/clamping mechanisms for attaching the plate 202 to various surfaces.

The plate 202 includes surfaces defining a plurality of passages 208a–b. Contacts 204a–b inserted within the passages 208a–b extend through the thickness of the plate 202 between the top surface 206 and the bottom surface. Each contact 204a–b may span across the entire cross-section of their respective passage 208a–b, such that the passages 208a–b are not visible once the contact 204a–b is positioned in the plate 202. The contacts 204a–b may be loosely held in place in the passages 208a–b by contact retention surfaces formed in the plate 202. In other embodiments, the contacts 204a–b may be solidly anchored to the plate. For example, the contacts 204a–b may be molded into the plate 202.

The passages 208a–b and their associated contacts 204a–b are typically arranged close to each other, forming a dense array 230. The array 230 may be, without limitation, rectangular, square, or circular in shape. In various embodiments, the array 230 may include gaps (in addition to defined spacing between passages 208a–b), where no passages 208a–b are positioned. For example, the center region of the array 230 may be void of passages 208a–b.

The passages 208a–b are aligned so that the contacts 204a–b can form electrical connections when compressed between a first contact array (not shown) on a first surface 220 and a second contact array 270 on a second surface 222. The first surface 220 may be, without limitation, of an integrated circuit, and the second surface 222 a circuit board. In other embodiments, both surfaces may be circuit boards. The contacts of the first contact array and/or second contact array 270 may be, for example, lands that are flat and rectangular in shape, forming a LGA, or in the shape of balls, forming a Ball Grid Array (BGA).

Each contact 204a–b includes a first contact surface for electrically engaging the first contact array on the first surface 220, and a second contact surface for electrically engaging the second contact array 270 on the second surface 222. To provide the necessary compressive force across each contact 204a–b and account for any variance in the planarity of the components, the contacts 204a–b on the LGA socket 106 are typically made of a compliant material. The term "compliant," as used in the description and the accompanying claims, shall mean elastic, resilient, and/or flexible, unless the context otherwise requires.

Figure 3A:
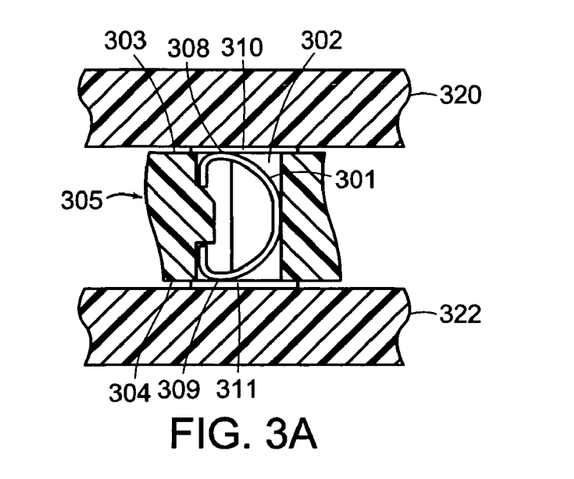
FIG. 3A is a schematic of an exemplary LGA contact formed from a metal spring in the shape of a "c" (prior art)
Figure 3B:
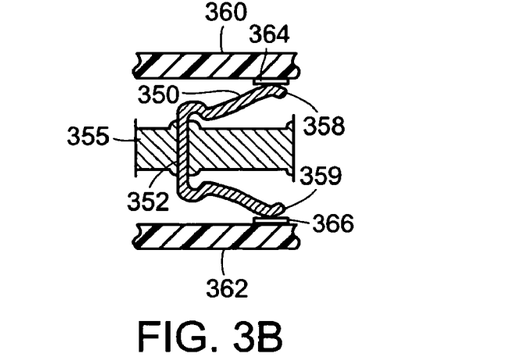
FIG. 3B is a schematic of an exemplary LGA contact formed from a metal spring having metal fingers (prior art)
Figure 3C:
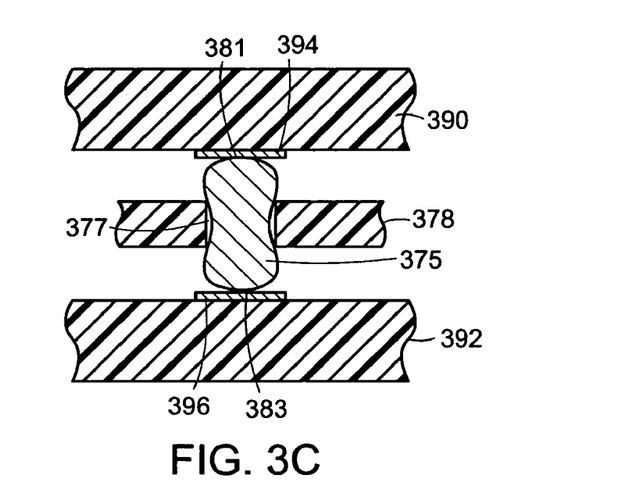
FIG. 3C is a perspective view of an exemplary LGA contact shaped as a button (prior art)

Common LGA socket technologies which may be used, without limitation, include contacts which range from compressible conductive spring designs to conductive metal or elastomer composites. FIGS. 3A–C (prior art) show exemplary embodiments of LGA socket contacts. FIG. 3A shows a LGA contact formed from a spring 301 in the shape of a "c", described in more detail in U.S. Pat. No. 6,217,342. The spring 301, which may be made of a metal, such as beryllium copper, includes a first contact surface 308 and a second contact surface 309 for electrically engaging contact pads 310 and 311 on a first and a second surface 320 and 322, respectively. The spring 301 is inserted into a passage 302 in an insulated plate 305, and protrudes slightly above the top surface 303 and bottom surface 304 of the plate 305. When the spring 301 is compressed between contact pads of the first and second surface 320 and 322, the spring 301 is compressed flush to the plate 305. Compression of the spring 301 ensures a proper electrical connection is made between the first and second contact surfaces 308 and 309 of the spring 301 and the contact pads 310 and 311 of the first and second surfaces 320 and 322, respectively.

FIG. 3B shows another LGA socket contact formed from a metal spring 350, described in more detail in U.S. Pat. No. 6,604,950. The metal spring 350 is anchored in a passage 352 of an insulated plate 355, and includes a first finger 358 and a second finger 359. The spring 350 is compressed between a first surface 360 and the second surface 362. The compressive force ensures that the first finger 358 and second finger 359 of the spring 350 electrically engage contact pads 364 and 366 on the first and second surfaces 360 and 362, respectively.

FIG. 3C shows yet another type of LGA socket contact formed from a cylindrical button 375, developed by such companies as Cinch Connectors, Inc. The button 375 is compressible and may be made, for example, by randomly winding gold plated molybdenum or tungsten wire into a cylinder. The button 375 is loaded into a passage 377 in an insulated plate 378 so as to project above and below the plate 378. The button includes an upper and lower contact surface 381 and 383, which are compressed between, and electrically engage, contact pads 394 and 396 of a first and second surface 390 and 392, respectively.

In illustrative embodiments of the invention, the contacts of the LGA socket are diverse and non-uniform. For example, certain contacts may be high current contacts capable of passing more current than low current contacts. To that end, as shown in FIG. 2, high current contacts 204b may be larger and hence capable of passing more current than low current contacts 204a. A high current contact 204b may occupy an area at least twice as large as a low current contact 204a, and in various embodiments, replace upwards of, without limitation, thirty to forty low current contacts.

Figure 4A:
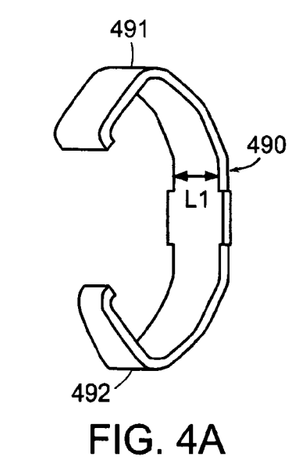
FIG. 4A is a perspective view of a low current contact formed from a metal spring in the shape of a "c"
Figure 4B:
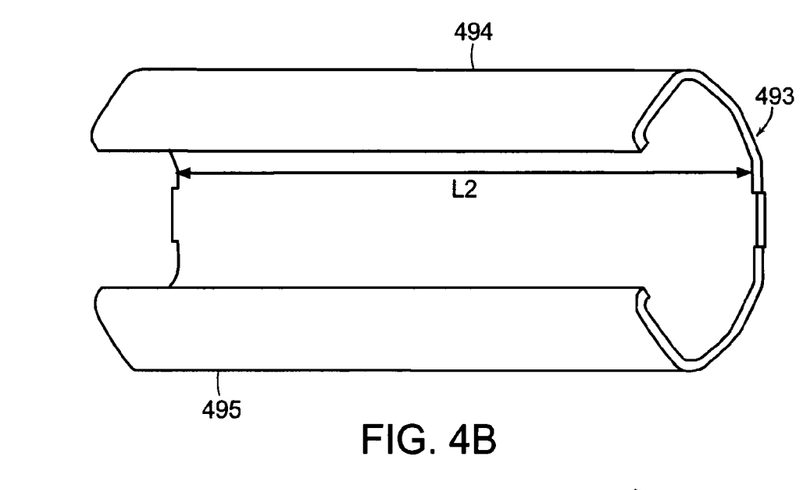
FIG. 4B is a perspective view of a high current contact formed from a metal spring in the shape of a "c", in accordance with one embodiment of the invention.

Compared to a low current contact 204a, a high current contact 204b may have, without limitation, a longer length and/or width compared to the low current contact 204a. FIG. 4A is a perspective view of a low current contact 490 formed from a metal spring in the shape of a "c" that has a length L1. FIG. 4B shows a high current contact 494 with form similar to contact 490 but having a length L2 that is longer than L1, in accordance with one embodiment of the invention. The contact surfaces 494 and 495 of the high current contact 493 are typically, but not necessarily, larger than contact surfaces 491 and 492 of the low current contact 490. In still other embodiments, the high current contact 493 may not be of the same shape or even be based on the same technology as the low current contact 490.

Figure 4C:
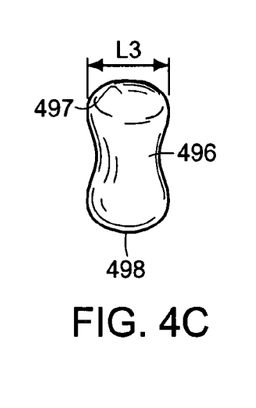
FIG. 4C is a perspective view of a low current contact in the shape of a button.
Figure 4D:
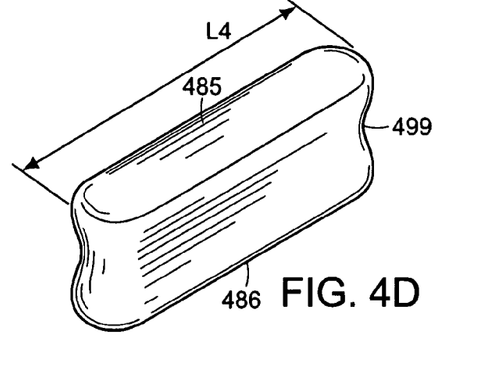
FIG. 4D is a perspective view of a high current contact in the shape of a button, in accordance with one embodiment of the invention.

As a further example, FIG. 4C shows a perspective view of a low current contact 496 that is in the form of a cylindrical button having contact surfaces 497 and 498. The low current contact 496 has a length L3. By increasing the length L3 of the low current contact 496, a high current contact 499 may be realized as shown in FIG. 4D, in accordance with one embodiment of the invention. The high current contact 499 has a longer length L4 and increased contact surface area 485 and 486 compared to low current contact 496, and is thus able to pass more current than low current contact 496.

Referring back to FIG. 2, to accommodate the varying sizes of the contacts 204a–b, the passages 208a–b through the plate 202 may vary in dimension. For example, the plate 202 may include both small passages 208a and large passages 208b into which the smaller low current contacts 204a and larger high current contacts 204b are inserted, respectively. The large passages 208b may vary not only in size, but also in shape from the small passages 208a. A large passage 208b may be, without limitation, in the form of an elongated slot that has a length much greater than that of a small passage 208a. Depending on the desired placement of the high current contacts 204b (discussed in more detail below), at least some of the large passages 208b may be positioned, for example, on the outside perimeter of the array.

In various embodiments, the high current contact 204b may take up less area of the array 230 compared to a plurality of low current contacts 204a with equivalent overall current carrying capability. Typically, each low current contact 204a is spaced a small, uniform distance apart from neighboring contacts in the array 230. The high current contact 204b, with larger dimensions than the low current contact 204a, extends across areas of the array 230 that would have been utilized for this spacing between low current contacts 204a. Using high current contacts 204b to pass high current, instead of a plurality of low current contacts 204a, thus frees up array area that can be advantageously exploited.

For example, the space advantage gained by using high current contacts 204b can be used to place one or more electronic components 280a–b between the LGA socket 200 and the first 220 and/or second surfaces 222. The electronic components 280a–b may include, without limitation, a resistor 280a and/or a capacitor 280b that is surface mounted to one of the surfaces 220 or 222. The electronic components 280a–b are aligned with those areas of the array 230 that are void of contacts (i.e., the freed up array area 275 resulting from the use of the high current contacts 204b) when the surfaces 220 and 222 are pressed against the LGA socket 200. The height of the electronic components 280a–b relative to the surface to which it is mounted 220 or 222 may be selected so that the electronic components 280a–b does not make contact with the plate 202 when the surfaces 220 and 222 are pressed against the LGA socket 200. Alternatively, the electronic components 280a–b may contact the plate 202, and help maintain the surfaces 220 and 222 apart from the plate 202 a desired distance.

In other embodiments, the space advantage gained by the use of high current contacts 204b can be used to decrease the area of the array 230/socket 200. Decreasing the size of the array 230/socket 200 minimizes warpage in the surfaces involved, and decreases the total compressive load needed to ensure proper electrical contact between the socket 200 and first and second surfaces 220 and 222. In still other embodiments, the space advantage may be utilized to increase the number of contacts 304a–b in the array 230.

The larger high current contacts 204b may also be advantageously utilized for controlling flatness across the array 230, in accordance with one embodiment of the invention. For example, the larger dimensions of a high current contact 204b can allow the high power contact 204b to function as a spacer. The spacer acts, either through a mechanical stop or by elastic resistance to compressive forces, to maintain the first and second surfaces 220 and 222 apart from the plate 202 a desired and uniform distance. Thus, depending on the placement of the high current contacts 204b, warpage in the first and second surfaces 220 and 222 can be minimized and a more uniform load distribution over the low current contact(s) 204(a) can be achieved. The high current contact(s) 204b may also be used as a stop to prevent over-compression of various contacts within the array 230. Note that in various embodiments, the plate 202 is thick compared to the height of the contacts 204a–b so that when the socket 200 is compressed, the first and second surfaces 220 and 222 contact the plate 202 without over compressing the contacts 204a–b. In such embodiments, additional spacer functionality may not be needed.

Figure 5:
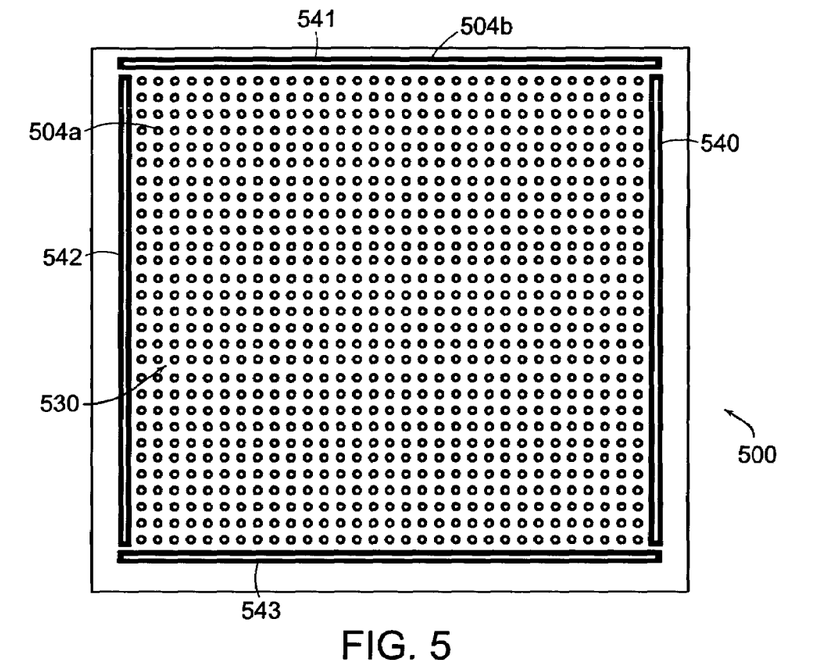
FIG. 5 is a schematic showing a top view of a socket that includes a plurality of contacts forming an array, in which at least one high current contact is positioned on the outer perimeter of the array, in accordance with one embodiment of the invention.

FIG. 5 is a schematic showing a top view of a LGA socket 500 in which high current contacts 504b functioning, in part, as spacers are positioned on the outer perimeter of a contact array 530, in accordance with one embodiment of the invention. Uniform spacing is thus achieved across the entire outer perimeter of the array 530. Low current contacts 504a are positioned within the contact array 530, and/or may be intermingled with the high current contacts 504b positioned on the outer perimeter of the contact array 530.

The exemplary contact array 530 shown in FIG. 5 forms a rectangle having four sides 540–543. A high current contact(s) 504b is positioned on, and expands across, each of the four sides 540–543 of the contact array 530 to provide uniform spacing across the entire outer perimeter of the contact array 530. The high power contact(s) 504b may have various orientations with respect to the array 530. For example, the length of the high power contact 504b along the outer perimeter of the contact array 530 may be, without limitation, diagonal, parallel (as shown in FIG. 5) or perpendicular (see FIG. 6) to the outer perimeter of the contact array 530.

In accordance with further embodiments of the invention, the larger high current contacts 504b (with or without spacer functionality) on the outside perimeter of the contact array 530 may be used to shield contacts 504a positioned within the contact array 530 from electromagnetic interference. The high current contacts 504b may provide, for example, effective grounding connections between the first and second surface 220 and 222 (see FIG. 2), reducing EMI interference received by contacts 504a–b within the contact array 530.

Figure 6:
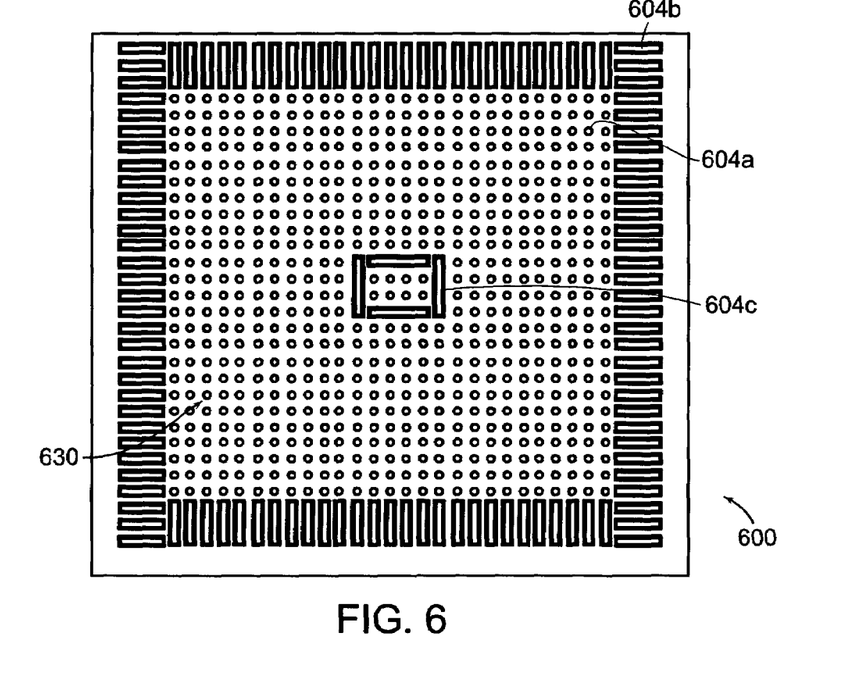
FIG. 6 is a schematic showing a top view of a socket that includes a plurality of contacts forming an array, in which at least one high current contact is positioned near the center of the array, in accordance with one embodiment of the invention.

High current contacts 504b may be selectively positioned anywhere within the contact array 530 to provide spacing and/or to shield other contacts from EMI, and are not limited to the outer perimeter of the contact array 530. FIG. 6 is a schematic showing a top view of a socket 600 that includes high current contacts 604b and 604c positioned on both the perimeter and near the center of a contact array 630, respectively, in accordance with one embodiment of the invention. High current contacts 604b, which have a length oriented perpendicular to the perimeter of the contact array 630, provide uniform spacing across the perimeter of the contact array 630, while high power contacts 604c provide appropriate spacing near the center of the contact array 630. High power contacts 604a–b may also serve to protect various low current contacts 604a from EMI interference, as discussed above.

Referring back to FIG. 2, the size and orientation of the diverse contacts 204a–b may also be used for aligning the socket 200 with the first and/or second surface 220 and 222. For example, the high current contacts 204b may be placed in asymmetrical fashion in the array, so that proper alignment of the socket 200 with the first and/or second surface 220 and 222 can be ascertained.

Although various exemplary embodiments of the invention have been disclosed, it should be apparent to those skilled in the art that various changes and modifications can be made which will achieve some of the advantages of the invention without departing from the true scope of the invention. These and other obvious modifications are intended to be covered by the appended claims.

What is claimed is:

1. A socket for forming electrical connections between a first surface having a first contact array and a second surface having a second contact array, the socket comprising:
    a plate having a thickness, the plate including surfaces defining a plurality of passages extending through the thickness of the plate; and
    a plurality of compliant contacts, each contact inserted into one of the passages, each contact including a first contact surface for electrically engaging the first contact array and a second contact surface for electrically engaging the second contact array, wherein at least one of the contacts is a low current contact, and at least an other one of the contacts is a high current contact capable of passing more current than the low current contact,
    wherein the first contact surface consists of a first unitary surface area and the second contact surface consists of a second unitary surface area, and
    wherein the first and second contact surface areas of the high current contact are larger than the first and second contact surface areas, respectively, of the low current contact.

2. The socket according to claim 1, wherein a respective surface area of the first and second contact surfaces of the high current contact is at least twice as large as a corresponding respective surface area of the first and second contact surfaces of the low current contact.

3. The socket according to claim 1, wherein the high current contact acts as a spacer when a compressive load is applied to the socket.

4. The socket according to claim 1, wherein the high current contact varies in shape from the at least one low current contact so as to provide alignment information.

5. The socket according to claim 1, wherein the plate is made from a single piece of insulating material.

6. The socket according to claim 1, further comprising a frame attached to the plate.

7. The socket according to claim 1, wherein at least one of the first contact array and second contact array is one of a land grid array and a ball grid array.

8. The socket according to claim 1, wherein the plurality of contacts form an array having an outer periphery, the high current contact positioned on the outer periphery.

9. The socket according to claim 8, wherein the high current contact at least partially shields one or more contacts positioned within the array from electromagnetic interference.

10. The socket according to claim 9, wherein the array is a rectangular array having four sides, and wherein one or more high current contacts are positioned on each side of the rectangular array.

11. A socket assembly comprising:
    a first surface including a first contact array;
    a second surface including a second contact array; and
    a socket of claim 1, wherein the first contact surface of each contact is electrically coupled to the first contact array, and the second contact surface of each contact is electrically coupled to the second contact array.

12. The socket assembly according to claim 11, wherein the first surface is of an integrated circuit and the second surface is of a circuit board.

13. The socket assembly according to claim 11, wherein one of the first surface and the second surface is a circuit board, and wherein at least one of a capacitor and a resistor is positioned between the array socket and the circuit board.

14. A method of passing signals between a first surface having a first contact array and a second surface having a second contact array, the method comprising:
    providing a socket having a plurality of compliant contacts, wherein at least one of the contacts is a low current contact and at least an other one of the contacts is a high current contact;
    compressing the socket between the first surface and the second surface, such that a first contact surface of each contact is electrically coupled to the first contact array, and a second contact surface of each contact is electrically coupled to the second contact array, and
    passing a current through the high current contact, the current greater than a maximum current that can be passed through the low current contact,
    wherein the first contact surface consists of a first unitary surface area and the second contact surface consists of a second unitary surface area, and
    wherein the first and second contact surface areas of the high current contact are larger than the first and second contact surface areas, respectively, of the low current contact.

15. The method according to claim 14, wherein one of the first surface and the second surface is a circuit board, the method further including positioning at least one of a capacitor and a resistor between the socket and the circuit board.

16. The method according to claim 14, further comprising connecting the high current contact to one of a ground signal or a power signal.

17. The method according to claim 14, wherein the high current contact acts as a spacer.

18. The method according to claim 14, further comprising using the high current contact to shield at least one of the plurality of contacts from electromagnetic interference.

19. The method according to claim 14 wherein at least one of the first contact array and second contact array is one of a land grid array and a ball grid array.

20. A socket for forming electrical connections between a first surface having a first contact array and a second surface having a second contact array, the socket comprising:
- a plate having a thickness, the plate including surfaces defining a plurality of passages extending through the thickness of the plate; and
- a plurality of compliant contacts, each contact inserted into one of the passages, each contact including a first contact surface for electrically engaging the first contact array and a second contact surface for electrically engaging the second contact array,
- wherein at least one of the contacts is a small contact and at least an other one of the contacts is a large contact, wherein the first contact surface consists of a first unitary surface area and the second contact surface consists of a second unitary surface area and wherein the first and second contact surface areas of the large contact are at least twice as large in area as the first and second contact surfaces of the small contact.

21. The socket according to claim 20, wherein the large contact is capable of passing more current than the small contact.

22. The socket according to claim 20 wherein the large contact acts as a spacer.

23. The socket according to claim 20, wherein at least one of the first contact array and second contact array is one of a land grid array and a ball grid array.

24. The socket according to claim 20, wherein the plurality of contacts form an array having an outer periphery, the large contact positioned on the outer periphery.

25. The socket according to claim 24, wherein the large current contact at least partially shields one or more contacts positioned within the array from electromagnetic interference.

26. A socket assembly comprising:
- a first surface including a first contact array;
- a second surface including a second contact array; and
- a socket of claim 20, wherein the first contact surface of each contact is electrically coupled to the first contact array, and the second contact surface of each contact is electrically coupled to the second contact array.

27. The socket according to claim 26, wherein one of the first surface and the second surface is a circuit board, and wherein at least one electronic component is positioned between the socket and the circuit board.

28. The socket according to claim 27, wherein the at least one electronic component is selected from the group of electronic components consisting of a capacitor and a resistor.

29. A method of passing signals between a first surface having a first contact array and a second surface having a second contact array, the method comprising:
- providing a socket having a plurality of compliant contacts, wherein at least one of the contacts is a small contact and at least an other one of the contacts is a large contact; and
- compressing the socket between the first surface and the second surface, such that a first contact surface of each contact is electrically coupled to the first contact array, and a second contact surface of each contact is electrically coupled to the second contact array,
- wherein the first contact surface consists of a first unitary surface area and the second contact surface consists of a second unitary surface area, and
- wherein the first and second contact surface areas of the large contact are larger than the first and second contact surface areas, respectively, of the small contact, and
- wherein a respective surface area of the first and second contact surfaces of the large contact is at least twice as large as a corresponding respective surface area of the first and second contact surfaces of the small contact.

30. The method of claim 29, further comprising passing a current through the large contact, the current greater than a maximum current that can be passed through the small contact.

31. The method according to claim 29, wherein the large contact acts as a spacer.

32. The method according to claim 29, further comprising using the large contact to shield at least one of the plurality of contacts from electromagnetic interference.

33. The method according to claim 29, wherein one of the first surface and the second surface is a circuit board, the method further including positioning at least one electronic component between the socket and the circuit board.

34. A plate for a socket, the socket including a plurality of double sided contacts for forming electrical connections between a first surface having a first contact array and a second surface having a second contact array, the plate, having a thickness, the plate comprising:
- surfaces defining an array of passages, each passage extending through the thickness of the plate such that one of the contacts can be inserted into each passage,
- wherein at least one of the passages is a small passage having a first size, and at least an other one of the passages is a large passage having a second size larger than the first size, the large passage capable of having a larger contact inserted therein compared to the small passage,
- wherein the array has an outer periphery and only large passages are positioned on the outer periphery.

35. The plate according to claim 34, wherein the large passage forms a rectangle extending a length of at least two or more small passages.

* * * * *